United States Patent
Yamamoto et al.

(12)

(10) Patent No.: US 6,319,619 B1
(45) Date of Patent: Nov. 20, 2001

(54) SEMICONDUCTOR SEALING RESIN COMPOSITION, SEMICONDUCTOR DEVICE SEALED WITH THE SAME, AND PROCESS FOR PREPARING SEMICONDUCTOR DEVICE

(75) Inventors: Yuko Yamamoto; Miho Yamaguchi; Hitomi Shigyo, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/403,311

(22) PCT Filed: Mar. 19, 1998

(86) PCT No.: PCT/JP98/01190

§ 371 Date: Oct. 20, 1999

§ 102(e) Date: Oct. 20, 1999

(87) PCT Pub. No.: WO98/47968

PCT Pub. Date: Oct. 29, 1998

(30) Foreign Application Priority Data

Apr. 21, 1997 (JP) .................................................... 9-103646

(51) Int. Cl.$^7$ .................................................. H01L 29/12
(52) U.S. Cl. ..................... 428/620; 257/789; 257/795; 428/413; 428/418; 523/442; 523/457; 523/458; 523/459; 524/413; 524/435; 524/436; 524/437
(58) Field of Search ..................... 523/440, 442, 523/457, 458, 459; 524/413, 435, 436, 437; 257/789, 795; 428/620, 413, 418

(56) References Cited

U.S. PATENT DOCUMENTS

| 3,661,829 | 5/1972 | Aignesberger et al. ............ 260/29.4 |
| 4,440,883 | 4/1984 | Pammer . |
| 4,719,255 | 1/1988 | Yoshizumi et al. . |
| 4,885,329 | 12/1989 | Tominaga et al. . |
| 4,923,912 | 5/1990 | Sasaki et al. . |
| 4,963,291 | 10/1990 | Bercaw . |
| 5,166,228 | 11/1992 | Shiobara et al. . |
| 5,290,882 | 3/1994 | Shiobara et al. . |
| 5,624,989 | 4/1997 | Yamaguchi et al . |
| 5,728,763 | 3/1998 | Yamaguchi et al. . |

FOREIGN PATENT DOCUMENTS

| 58-174434 | 10/1983 | (JP) . |
| 64-73561 | 3/1989 | (JP) . |
| 3-157448 | 7/1991 | (JP) . |
| 5-29495 | 2/1993 | (JP) . |
| 9-100337 | 4/1997 | (JP) . |
| 10-77390 | 3/1998 | (JP) . |

Primary Examiner—Robert Dawson
Assistant Examiner—D. Aylward
(74) Attorney, Agent, or Firm—Armstrong, Westerman, Hattori, McLeland & Naughton LLP

(57) ABSTRACT

The present invention relates to a semiconductor encapsulating resin composition which is safe and superior in moisture resistance, flame retardance and moldability, and to a highly reliable semiconductor device which is fabricated by encapsulating a semiconductor element with such a semiconductor encapsulating resin composition. The resin composition according to the present invention comprises a thermosetting resin, a hardening agent and a compound metal hydroxide of polyhedral crystal form represented by the following general formula (1):

$$m(M_aO_b).n(Q_dO_e).cH_2O \qquad (1)$$

[wherein M and Q are different metal elements; Q is a metal element which belongs to a group selected from IVa, Va, VIa, VIIa, VIII, Ib and IIb groups in the periodic table; m, n, a, b, c, d and e, which may be the same or different, each represents a positive number]. In accordance with the present invention, reduction in the fluidity of the resin composition can be suppressed, so that transfer molding can be performed with an improved moldability without any trouble. Further, the resin composition ensures improvement in soldering resistance and mechanical strength.

19 Claims, 1 Drawing Sheet

SEMICONDUCTOR SEALING RESIN COMPOSITION, SEMICONDUCTOR DEVICE SEALED WITH THE SAME, AND PROCESS FOR PREPARING SEMICONDUCTOR DEVICE

TECHNICAL FIELD

The present invention relates to a resin composition for semiconductor encapsulating which is superior in flame retardance, soldering resistance, moisture resistance reliability and fluidity, to a semiconductor device using such a resin composition, and to a process for fabricating such a semiconductor device.

BACKGROUND ARTS

It is a conventional practice to encapsulate semiconductor elements such as transistors, ICs and LSIs with ceramic materials and the like for fabrication of semiconductor devices. Recently, semiconductor devices of resin-encapsulated type employing plastic materials have become dominant in view of costs and mass productivity thereof. Epoxy resin compositions are conventionally used for the resin encapsulating of the semiconductor devices of this type, offering good performance. However, technological innovation in the semiconductor field has led to a higher integration degree, a larger device size and a more minute interconnection pattern, while the current trend is toward reduction in package size and thickness. This demands further improvement in the reliability of an encapsulating material.

On the other hand, electronic components such as semiconductor devices should absolutely satisfy the flame retardance requirement of the UL94 V-0 standard. One conventional method of imparting flame retardance to a resin composition for semiconductor encapsulating is to add a brominated epoxy resin and antimony oxide to the resin composition.

However, there are two critical problems associated with the aforesaid flame retardance imparting technique.

A first problem is that antimony trioxide itself has a toxicity and the resin composition, when burnt, emits hydrogen bromide, bromine-based gases, antimony bromide and the like which are harmful to human body and equipment because of their toxicity and corrosiveness.

A second problem is that, if a semiconductor device fabricated by utilizing the aforesaid flame retardance imparting technique is allowed to stand in a high temperature atmosphere for a long period, liberated bromine corrodes aluminum interconnections formed on a semiconductor element of the device. This results in breakdown of the semiconductor device, presenting the problem of reduction in the high temperature reliability of the device.

Proposed as one approach to the aforesaid problems is addition of an inorganic flame retardant of a halogen- and antimony-free metal hydroxide. However, this approach requires to use the metal hydroxide in a large amount (e.g., 40% by weight or greater), thereby posing new problemns.

A first problem is that the semiconductor device is liable to swell and crack during a soldering operation. In recant years, a surface mounting method has become dominant as a method for the mounting of the semiconductor device. The soldering operation employs a solder dipping process, an infrared reflow process, a vapor phase reflow process or the like. Whichever process is employed, the semiconductor device is subjected to a high temperature (typically, 215° C. to 260° C.). In the case of a semiconductor device encapsulated with a conventional resin composition containing the metal hydroxide, abrupt evaporation of water absorbed in the metal hydroxide causes the semiconductor device to swell and crack, because the metal hydroxide has a high water content. That is, the problem is associated with reduction in so-called soldering resistance.

A second problem is associated with moisture resistance reliability. That is, the performance of the semiconductor device is liable to deteriorate in a high temperature and high humidity atmosphere at a temperature of 80° C. to 200° C. and a relative humidity of 70% to 100%. Where the semiconductor device includes highly exothermic semiconductor elements or is mounted adjacent to an engine of an automobile, dehydration of the metal hydroxide occurs in the semiconductor device during prolonged use, thereby deteriorating the moisture resistance reliability.

The conventional flame retardance technique involves the aforesaid problems and, hence, there is a strong demand for development of a new flame retardance technique which uses a safe material free from emission of harmful gases when the material is burnt, and causes neither swelling nor cracking in a semiconductor device due to dehydration of the metal hydroxide during the soldering operation, nor the corrosion of aluminum interconnections on a semiconductor element of the device nor the deterioration in moisture resistance reliability even if the semiconductor device is allowed to stand in a high temperature and high humidity atmosphere for a long period. To solve the aforesaid problems, the inventors of the present invention previously proposed to employ a thermosetting resin composition for semiconductor encapsulating which contains a thermosetting resin, a hardening agent, a metal hydroxide and a metal oxide, or a compound metal hydroxide consisting of the metal hydroxide and the metal oxide (Japanese Patent Application No. HEI 7-507466). The use of the thermosetting resin composition for semiconductor encapsulating indeed improves the flame retardance and the moisture resistance reliability, but poses a new problem. When a semiconductor package having a reduced thickness (which is a recent trend) is molded by transfer molding or the like, the fluidity of the resin composition as the encapsulating material is reduced thereby to deform gold wires of a semiconductor device. That is, the problem is associated with remarkable deterioration of the moldability.

In view of the foregoing, it is an object of the present invention to provide a resin composition for semiconductor encapsulating which is safe and superior in moisture resistance reliability, flame retardance and moldability, a semiconductor device using such a resin composition, and a process for fabricating such a semiconductor device.

DISCLOSURE OF THE INVENTION

In accordance with a first aspect of the present invention to achieve the object described above, there is provided a resin composition for semiconductor encapsulating which contains: (i) a thermosetting resin; (ii) a hardening agent; and (iii) a compound metal hydroxide of polyhedral crystal form represented by the following general formula (1):

$$m(M_aO_b) \cdot n(Q_dO_e) \cdot cH_2O \qquad (1)$$

[wherein M and Q are different metal elements; Q is a metal element which belongs to a group selected from IVa, Va, VIa, VIIa, VIII, Ib and IIb groups in the periodic table; m, n, a, b, c, d and e, which may be the same or different, each represents a positive number].

In accordance with a second aspect of the present invention, there is provided a semiconductor device fabricated by encapsulating a semiconductor element with the semiconductor encapsulating resin composition described above.

In accordance with a third aspect of the present invention, there is provided a process for fabricating a semiconductor device, which comprises the step of encapsulating a semiconductor element with the semiconductor encapsulating resin composition described above by a transfer molding method, or a process for fabricating a semiconductor device, which comprises the step of encapsulating a semiconductor element with a sheet encapsulating material composed of the semiconductor encapsulating resin composition described above.

The compound metal hydroxide of polyhedral crystal form as the component (iii) in the semiconductor encapsulating resin composition according to the present invention is a compound metal hydroxide which does not have a thin plate crystal form, e.g., a hexagonal plate form (as shown in FIG. 1) or a scaly form, but has a stereoscopic and nearly spherical particulate crystal form with a greater crystal growth degree in its thickness direction (c-axis direction), e.g., a generally octahedral or quadrihedral crystal form, which may be obtained by allowing the plate crystal to grow in its thickness direction (c-axis direction). The polyhedral crystal form may of course vary depending on the method for pulverization and milling of the compound metal hydroxide and the crystalline growth.

The inventors of the present invention carried out a series of researches to provide a semiconductor encapsulating resin composition which is safe and superior in soldering resistance, moisture resistance reliability, flame resistance and fluidity. In the researches, an intensive study was first made to determine a cause of the reduction in the fluidity of a semiconductor encapsulating resin composition containing the conventional compound metal hydroxide. As a result, it was found that the reduction in the fluidity is attributable to the crystal form of the compound metal hydroxide. More specifically, the compound metal hydroxide typically has a plate crystal form such as a hexagonal plate form or a scaly form and, when the semiconductor encapsulating is achieved by the transfer molding method by employing a resin composition containing the compound metal oxide having such a crystal form, the fluidity of the resin composition is remarkably reduced thereby to cause the deformation of gold wires of a semiconductor device. Based on this finding, the inventors further made researches with the aim of suppression of the reduction in the fluidity. As a result, it was found that the reduction in the fluidity of the resin composition can be suppressed for improvement of the moldability without any trouble in the transfer molding process, by employing a compound metal hydroxide which has a specific average particle diameter and has a polyhedral crystal form with a greater crystalline growth degree in its thickness direction rather than a plate crystal form such as a hexagonal plate form or a scaly form. Thus, the inventors have attained the present invention.

Where this particular compound metal hydroxide having the aforesaid crystal form has an average particle diameter of 0.5 $\mu$m to 10 $\mu$m, an excellent flame retardant effect can be offered, and the reduction in the fluidity of the resulting resin composition can be suppressed for further improvement of the moldability.

Where the compound metal hydroxide has an aspect ratio of 1 to 8, the viscosity of the resulting resin composition can be reduced for further improvement of the moldability. Within the aspect ratio range between 1 and 8, an aspect ratio of 2 to 7 is more preferable.

BEST MODE FOR CARRYING OUT THE INVENTION

Figure 1:
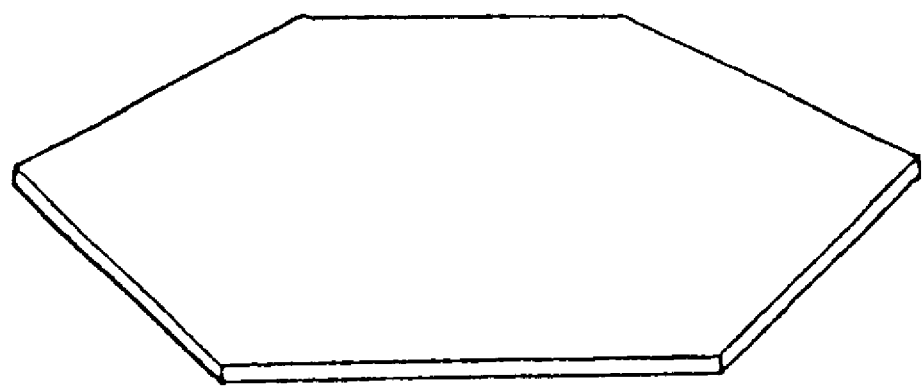
FIG. 1 is a perspective view illustrating a hexagonal plate crystal form which is one typical crystal form of a conventional compound metal hydroxide.

Embodiments of the present invention will next be described in detail.

A resin composition for semiconductor encapsulating in accordance with the present invention is prepared from a thermosetting resin (component (i)), a hardening agent (component (ii)) and a specific compound metal hydroxide (component (iii)). The resin composition is typically in a powdery form, or the powdery resin composition is formed into a tablet. Alternatively, the resin composition, after having been melted and kneaded, is formed into granules such as of a generally cylindrical shape, or formed into a sheet encapsulating material.

Examples of the thermosetting resin (component (i)) include epoxy resins, polymaleimide resins, unsaturated polyester resins and phenol resins, among which the epoxy resins and the polymaleimide resins are particularly preferred in the present invention.

The epoxy resins to be used are not particularly limited, but any of conventionally known epoxy resins may be used. Examples of specific epoxy resins include those of bisphenol-A type, phenol novolak type, cresol novolak type and biphenyl type.

The polymaleimide resins to be used are not particularly limited, but any of conventionally known polymaleimide resins may be used which have two or more maleimide groups in one molecule thereof. Examples of specific polymaleimide resins include N,N'-4,4'-diphenylmethanebismaleimide and 2,2-bis-[4-(4-maleimidephenoxy)phenyl]propane.

Usable as the hardening agent (component (ii)) in combination of the aforesaid thermosetting resin (component(i)) is any of conventionally known hardening agents such as phenol resins, acid anhydrides and amine compounds. Where an epoxy resin is used as the thermosetting resin, a phenol resin is preferably used as the hardening agent. Examples of specific phenol resins include phenol novolak resins, cresol novolak resins, bisphenol-A novolak resins, naphthol novolak resins and phenol aralkyl resins. Where an epoxy resin of biphenyl type is used as the epoxy resin, a phenol aralkyl resin is preferably used as the hardening agent.

Where a polymaleimide resin is used as the thermosetting resin, the hardening agent to be used is not particularly limited, but any of conventionally known hardening agents may be used. Examples thereof include amines and alkenyl phenols which are obtained by reacting the aforesaid epoxy resin hardening agents with a allyl halide in the presence of an alkali.

Where an epoxy resin and a phenol resin are employed as the thermosetting resin (component( i)) and the hardening agent (component (ii)), respectively, the proportions thereof are preferably set so that the phenol resin has 0.7 to 1.3 equivalents, particularly 0.9 to 1.1 equivalents, of hydroxyl groups per equivalent of epoxy groups in the epoxy resin.

The specific compound metal hydroxide to be used in combination with the thermosetting resin (component (i))

and the hardening agent (component (ii)) has a polyhedral crystal form and is represented by the following general formula (1):

$$m(M_aO_b) \cdot n(Q_dO_e) \cdot cH_2O \qquad (1)$$

(wherein M and Q are different metal elements; Q is a metal element which belongs to a group selected from IVa, Va VIa, VIIa, VIII, Ib and IIb groups in the periodic table; m, n, a, b, c, d and e, which may be the same or different, each represents a positive number).

In the compound metal hydroxide represented by the general formula (1), examples of the metal element M include Al, Mg, Ca, Ni, Co, Sn, Zn, Cu, Fe, Ti and B.

In the compound metal hydroxide represented by the general formula (1), the other metal element Q is a metal element which belongs to a group selected from IVa, Va, VIa, VIIa, VIII, Ib and IIb groups in the periodic table. Examples of the metal element Q include iron, cobalt, nickel, palladium, copper, zinc and cadmium. These metal elements are used either alone or in combination.

By controlling the conditions for the preparation of the compound metal hydroxide of polyhedral crystal form, the compound metal hydroxide is allowed to have any desired polyhedral crystal form such as a generally octahedral or quadrihedral crystal form having a greater crystal growth degree in its thickness direction (c-axis direction).

The compound metal hydroxide of polyhedral crystal form to be used in the present invention has, for example, a generally octahedral outer shape with an aspect ratio of about 1 to about 8, preferably 2 to 7. Where the metal elements M and Q are Mg and Zn, respectively, in the formula (1), for example, the compound metal hydroxide can be prepared in the following manner. First, a zinc nitrate compound is added to an aqueous solution of magnesium hydroxide for preparation of a partial compound metal hydroxide which is to be used as a raw material. Then, the raw material is baked at a temperature ranging from 800° C. to 1,500° C., more preferably from 1,000° C. to 1,300° C. for preparation of a compound metal oxide. The resulting compound metal oxide is represented by a composition formula $m(MgO) \cdot n(znO)$. The compound metal oxide is vigorously stirred in an aqueous solution containing acetic acid in an amount of about 0.1 mol % to about 6 mol % relative to the compound metal oxide at a temperature of not lower than 40° C. for hydration thereof. Thus, the compound metal hydroxide having the polyhedral crystal form and represented by a composition formula $m(MgO) \cdot n(ZnO) \cdot cH_2O$ in accordance with the present invention is prepared.

Exemplary compound metal hydroxides of polyhedral crystal form include $sMgO \cdot (1-s)NiO \cdot cH_2O$ [$0<s<1, 0<c \leq 1$], $sMgO \cdot (1-s)ZnO \cdot cH_2O$ [$0<s<1, 0<c \leq 1$] and $sAl_2O_3 \cdot (1-s)Fe_2O_3 \cdot cH_2O$ [$0<s<1, 0<c \leq 3$], among which hydrates of magnesium oxide/nickel oxide and hydrates of magnesium oxide/zinc oxide are particularly preferred.

The compound metal hydroxide of polyhedral crystal form (component (iii)) preferably has an average particle diameter of 0.5 μm to 10 μm, more preferably 0.6 μm to 6 μm, as measured by a laser granulometer. If the average particle diameter of the compound metal hydroxide is greater than 10 μm, the flame retardance effect is liable to be diminished.

The compound metal hydroxide of polyhedral crystal form (component (iii)) preferably has an aspect ratio of 1 to 8, particularly 2 to 7. The term "aspect ratio" is herein meant by the ratio of a major diameter to a minor diameter of a particle of the compound metal hydroxide. If the compound metal hydroxide has an aspect ratio of greater than 8, a resin composition containing such a compound metal hydroxide cannot enjoy a satisfactory melt viscosity reducing effect.

In the present invention, the compound metal hydroxide of polyhedral crystal form (component (iii)) may be used in combination with a conventional compound metal hydroxide of thin plate crystal form. For effective reduction of the melt viscosity of the semiconductor encapsulating resin composition according to the present invention, the proportion of the compound metal hydroxide of polyhedral crystal form is preferably set in a range from 30% to 100% by weight based on the total weight of the compound metal hydroxides (including the conventional compound metal hydroxide of thin plate crystal form) to be used. If the proportion of the compound metal hydroxide of polyhedral crystal form is lower than 30% by weight, the resulting resin composition cannot enjoy a satisfactory melt viscosity reducing effect.

The total amount of the compound metal hydroxides including the compound metal hydroxide of polyhedral crystal form (component (iii)) is preferably set in a range from 1% to 30% by weight, particularly from 2% to 28% by weight, based on the total weight of the resin composition to ensure an excellent flame retardant effect. If the total amount of the compound metal hydroxides is less than 1% by weight, the flame retardant effect is unsatisfactory. If the total amount is greater than 30% by weight, the concentration of chlorine ions present in a cured form of the resin composition is increased, so that the moisture resistance reliability is liable to deteriorate.

The semiconductor encapsulating resin composition according to the present invention may, as required, contain an inorganic filler as well as the conventional compound metal hydroxide of thin plate crystal form in addition of the components (i) to (iii). The inorganic filler to be used is not particularly limited, but any of conventionally known fillers may be used. Examples thereof include quartz glass powder, talc, silica powder, alumina powder, calcium carbonate, boron nitride, silicon nitride and carbon black powder. These may be used either alone or in combination. The silica powder is preferably used as the inorganic filler because the linear expansion coefficient of a cured form of the resulting resin composition can be reduced. A spherical silica powder, particularly a fused silica powder, is preferred to impart the resin composition with a high fluidity. The inorganic filler preferably has an average particle diameter ranging from 10 μm to 70 μm, more preferably from 20 μm to 50 μm. Where the compound metal hydroxide has an average particle diameter within the aforesaid range and the inorganic filler has an average particle diameter within the aforesaid range, a satisfactory fluidity can be imparted to the resin composition. A milled silica powder obtained through a powdery silica milling process may also be used as the silica powder.

The proportion of the inorganic filler to be contained is preferably such that the total amount of the inorganic components including the inorganic filler and the compound metal hydroxides (the compound metal hydroxide of polyhedral crystal form and the conventional compound metal hydroxide of thin plate crystal form) is 60% to 92% by weight, particularly 70% to 90% by weight, based on the total weight of the semiconductor encapsulating resin composition. If the total amount of the inorganic components is smaller than 60% by weight, the flame retardance of the resulting resin composition is deteriorated.

Where the compound metal hydroxides including the compound metal hydroxide of polyhedral crystal form (component (iii)) are used in combination with the inorganic filler, the weight ratio of the compound metal hydroxides (x)

to the inorganic filler (y) is preferably x/y=0.01/1 to 1/1, more preferably x/y=0.01/1 to 0.75/1.

The concentration of chlorine ions present in the semiconductor encapsulating resin composition is preferably such that the concentration of chlorine ions extracted from a cured form of the resin composition into extraction water is not higher than 200 µg per gram of the cured resin composition as determined in the following manner. More specifically, 5 g of powder of the cured thermosetting resin composition and 50 cc of distilled water are put in a special extraction vessel land the vessel is allowed to stand in a dryer at 160° C. for 20 hours for the extraction of chlorine ions in the extraction water (pH6.0 to pH8.0). The extraction water is analyzed by ion chromatography for determination of the concentration ($\alpha$) of chlorine ions. Since the chlorine ion concentration ($\alpha$) thus determined is a 10-time diluted chlorine ion concentration of the cured resin composition, a chlorine ion concentration per gram of the cured resin composition is calculated from the following expression. The pH level of the extraction water is preferably pH6.0 to pH8.0. Chlorine ion concentration (µg) per gram=$\alpha \times (50/5)$ If the concentration of chlorine ions extracted out to the cured resin composition into the extraction water is greater than 200 µg, the resin composition tends to cause corrosion of a semiconductor element, a lead frame and the like, and has a lower moisture resistance.

The semiconductor encapsulating resin composition according to the present invention may contain, in addition to the components (i) to (iii) and the inorganic filler, a curing accelerator, a pigment, a release agent, flexibilizer and the like as required.

Any of conventionally known curing accelerators can be used as the curing accelerator. Examples thereof include tertiary amines such as 1,8-diaza-bicyclo(5,4,0)undecen-7 and triethylenediamine, imidazoles such as 2-methylimidazole, and phosphorus-based curing accelerators such as triphenylphosphine and tetraphenylphosphonium tetraphenylborate.

Examples of the pigment include carbon black and titanium dioxide. Examples of the release agent include polyethylene waxes, paraffins, fatty acid esters and fatty acid salts.

Examples of the flexibilizer include coupling agents such as silane coupling agents, silicone resins and butadiene-acrylonitrile rubbers.

The semiconductor encapsulating resin composition preferably contains an organic flame retardant or a red phosphorus based flame retardant in addition to the aforesaid components to reduce the total amount Qf the compound metal hydroxides including the compound metal hydroxide of polyhedral crystal form to be used. Exemplary organic flame retardants include compounds having heterocyclic structures.

Examples of specific heterocyclic compounds includes melamine derivatives, cyanurate derivatives and isocyanurate derivatives. These may be used either alone or in combination.

The organic flame retardant may be blended with the resin composition after it is preliminarily mechanically mixed with the compound metal hydroxides. Alternatively, a flame retardant prepared by first dissolving the organic flame retardant in a solvent, then surface-treating the aforesaid compound metal hydroxides with the resulting solution and removing the solvent may be used.

The proportion of the organic flame retardant is preferably set in a range from 1% to 10% by weight, particularly from 1% to 5% by weight, based on the total weight of the aforesaid compound metal hydroxides (including the compound metal hydroxide of polyhedral crystal form and, as required, the conventional compound metal hydroxide of thin plate crystal form).

Examples of the red phosphorus based flame retardant include red phosphorus powder, and red phosphorus powder coated with any of various organic or inorganic compounds for protection thereof. The proportion of the red phosphorus based flame retardant is preferably set in a range from 1% to 10% by weight, particularly from 1% to 5% by weight, based on the total weight of the aforesaid compound metal hydroxides (including the compound metal hydroxide of polyhedral crystal form and, as required, the conventional compound metal hydroxide of thin plate crystal form) like the aforesaid organic flame retardant.

A preferable combination of the aforesaid components including the components (i) to (iii) to be contained in the semiconductor encapsulating resin composition according to the present invention is as follows: An epoxy resin, particularly a biphenyl type epoxy resin which has a high fluidity, is preferred as the thermosetting resin (component (i)). A phenol aralkyl resin is preferred as the hardening agent (component (ii)) in terms of the fluidity. Fused silica powder is preferably used as the inorganic filler in combination with the aforesaid specific compound metal hydroxide of polyhedral crystal form (component (iii)). Where the conventional compound metal hydroxide is used in addition to these components, the resulting resin composition tends to have a reduced releasability. Therefore, it is preferred to use a wax, particularly a polyethylene wax or an ester wax which has a high acid value on the order of not lower than 30 (typically, 200 at the highest).

The semiconductor encapsulating resin composition according to the present invention can be prepared in the following manner, for example. The thermosetting resin (component (i), the hardening agent (component (ii)), the compound metal hydroxide of polyhedral crystal form (component (iii)) and the inorganic filler and, as required, other additives are mixed together in a predetermined ratio. The resulting mixture is heated to be melted, and kneaded by means of a kneader such as a mixing roll. Then, the melt mixture is cooled to room temperature. Then, the resulting solid mixture is pulverized by a known method and, as required, the resulting powder is tableted. Through these steps, the semiconductor encapsulating resin composition of interest is prepared.

Alternatively, the mixture of the ingredients for the semiconductor encapsulating resin composition is melted and kneaded in the kneader, and the resulting melt mixture is subsequently formed into generally cylindrical granules. Through these steps, the semiconductor encapsulating resin composition in a granular form is prepared.

Further, the semiconductor encapsulating resin composition can be formed into a sheet by pouring the melt mixture of the ingredients for the semiconductor encapsulating resin composition into a pallet, cooling the melt mixture and press-calendering or roll-calendering the resulting mass, or by mixing the mixture with a solvent and spreading the resulting solution. Thus, the semiconductor encapsulating resin composition in a sheet form is prepared.

The method for the encapsulating of a semiconductor element by using the semiconductor encapsulating resin composition thus prepared (in the powdery, tablet, granular form, or the like) is not particularly limited, but the encapsulating of the semiconductor element can be achieved by any of know methods such as an ordinary transfer molding method.

Further, a semiconductor device can be fabricated by the flip chip package technique with the use of the semiconductor encapsulating resin composition in the sheet form, for example, in the following manner. The fabrication of the semiconductor device by the flip chip package technique is achieved by first placing a sheet of the semiconductor encapsulating resin composition on an electrode side of a semiconductor element having joint bumps or a bump joint side of a circuit board, then combining the semiconductor element and the circuit board via the bumps and encapsulating the semiconductor element and the circuit board with the resin composition.

Examples will next be described along with Comparative Examples.

First, the following ingredients were prepared:

[Epoxy resin a] Cresol novolak epoxy resin (epoxy equivalent 200)
[Epoxy resin b] Biphenyl epoxy resin (epoxy equivalent 195)
[Phenol resin c] Phenol novolak resin (hydroxyl equivalent 107)
[Phenol resin d] Phenol aralkyl resin (hydroxyl equivalent 174)
[Silica powder] Fused silica powder having an average particle diameter of 30 μm
[Phosphorus based curing accelerator] Triphenylphosphine
[Red phosphorus based flame retardant] Red phosphorus powder coated with a resin (Rin Kagaku Co., NOVAEXCELL)
[Ester wax] Carnauba wax
[Olefin wax] Polyethylene wax (acid value 160)

Prior to preparation of resin compositions according to Examples, compound metal hydroxides shown in the following Table 1 were prepared. Compound metal hydroxides A to C shown in Table 1 were prepared in accordance with the aforesaid preparation method for the compound metal hydroxide of polyhedral crystal form.

TABLE 1

| | | Composition formula | Average particle diameter | Crystal form | Aspect ratio |
|---|---|---|---|---|---|
| Compound metal hydroxide of polyhedrel form | A | $MgO.CuO.H_2O$ | 0.6 μm | Polyhedral | 3 |
| | B | $MgO.CoO.H_2O$ | 5.0 μm | Polyhedral | 6 |
| | C | $MgO.ZnO.H_2O$ | 1.0 μm | Polyhedral | 4 |
| Conventional compound metal hydroxide | D | $MgO.ZnO.H_2O$ | 3.0 μm | Hexagonal plate | — |
| | E | $MgO.NiO.H_2O$ | 0.7 μm | Scaly | — |
| Metal hydroxide | F | $MgO.H_2O$ | 0.7 μm | Hexagonal plate | — |

EXAMPLES 1 to 10 and Comparative Examples 1 to 3

Ingredients shown in the following Tables 2 to 4 were mixed together in weight ratios shown in the same tables, and the resulting mixtures were each melted and kneaded in a mixing roll (at a temperature of 100° C.) for 3 minutes. In turn, the melt mixture was cooled to be solidified, and the resulting solid mixture was pulverized. Thus, powdery epoxy resin compositions of interest were prepared.

TABLE 2

(parts by weight)

| | | Examples | | | | | |
|---|---|---|---|---|---|---|---|
| | | 1 | 2 | 3 | 4 | 5 | 6 |
| Epoxy resin | a | 63.8 | — | 63.8 | 63.8 | — | — |
| | b | — | 51.8 | — | — | 51.8 | 51.8 |
| Phenol resin | c | 34.2 | — | 34.2 | 34.2 | — | — |
| | d | — | 46.2 | — | — | 46.2 | 46.2 |
| Compound metal hydroxide | A | 100 | — | — | — | 50 | — |
| | B | — | 30 | — | — | — | 130 |
| | C | — | 70 | 100 | 70 | 50 | — |
| | D | — | — | — | 30 | — | — |
| Silica powder | | 150 | 199 | 300 | 300 | 465 | 420 |
| Phosphorus based curing accelerator | | 1.0 | 1.0 | 1.0 | 1.0 | 1.0 | 1.0 |
| Ester wax | | 0.2 | 0.2 | 0.2 | 0.2 | 0.2 | 0.2 |
| Olefin wax | | 0.8 | 0.8 | 0.8 | 0.8 | 0.8 | 0.8 |
| Carbon Black | | 1.0 | 1.0 | 1.0 | 1.0 | 1.0 | 1.0 |
| Proportion of compound metal hydroxides relative to total composition (wt %) | | 28.5 | 25.0 | 20.0 | 20.0 | 15.0 | 20.0 |
| Proportion of inorganic compounds relative to total composition (wt %) | | 71.2 | 74.8 | 79.8 | 79.8 | 84.8 | 84.5 |

TABLE 3

(parts by weight)

| | | Examples | | | |
|---|---|---|---|---|---|
| | | 7 | 8 | 9 | 10 |
| Epoxy resin | a | 63.8 | — | 63.8 | 63.8 |
| | b | — | 51.8 | — | — |
| Phenol resin | c | 34.2 | — | 34.2 | 34.2 |
| | d | — | 46.2 | — | — |
| Compound metal hydroxide | A | — | — | — | — |
| | B | — | 10 | — | — |
| | C | 50 | 30 | 50 | 30 |
| | D | — | — | — | 20 |
| Silica powder | | 850 | 255 | 345 | 345 |
| Phosphorus based curing accelerator | | 1.0 | 1.0 | 1.0 | 1.0 |
| Red phosphorus based flame retardant | | — | 8.0 | 5.0 | — |
| Ester wax | | 0.2 | 0.2 | 0.2 | 0.2 |
| Olefin wax | | 0.8 | 0.8 | 0.8 | 0.8 |
| Carbon Black | | 1.0 | 1.0 | 1.0 | 1.0 |
| Proportion of compound metal hydroxides (metal hydroxide) relative to total composition (wt %) | | 5.0 | 9.9 | 10.0 | 10.0 |
| Proportion of inorganic compounds relative to total composition (wt %) | | 89.9 | 75.0 | 79.8 | 79.8 |

TABLE 4

(parts by weight)

| | | Comparative Examples | | |
|---|---|---|---|---|
| | | 1 | 2 | 3 |
| Epoxy resin | a | — | 63.8 | 63.8 |
| | b | 51.8 | — | — |
| Phenol resin | c | — | 34.2 | 34.2 |
| | d | 46.2 | — | — |
| Compound metal hydroxide | A | — | — | — |
| | B | — | — | — |
| | C | — | — | — |

TABLE 4-continued

|  |  | (parts by weight) Comparative Examples | | |
|---|---|---|---|---|
|  |  | 1 | 2 | 3 |
|  | D | 100 | — | — |
|  | E | — | 100 | — |
| Metal hydroxide | F | — | — | 100 |
| Silica powder | | 465 | 300 | 300 |
| Phosphorus based curing accelerator | | 1.0 | 1.0 | 1.0 |
| Ester wax | | 0.2 | 0.2 | 0.2 |
| Olefin wax | | 0.8 | 0.8 | 0.8 |
| Carbon Black | | 1.0 | 1.0 | 1.0 |
| Proportion of compound metal hydroxides (metal hydroxide) relative to total compdsition (wt %) | | 15.0 | 20.0 | 20.0 |
| Proportion of inorganic compounds relative to total composition (wt %) | | 84.8 | 79.8 | 79.8 |

The concentration of chlorine ions present in a cured form of each of the epoxy resin compositions of Examples and Comparative Examples thus obtained was determined. The determination of the chlorine ion concentration was achieved in the previously described manner. Further, the epoxy resin compositions were each formed into a sheet having a thickness of 1/16 inch for preparation of a test strip. With the use of the test strip, the flame retardance of each of the resin compositions was evaluated in conformity with the UL94 V-0 standard. The determination results and the evaluation results are shown in Tables 5 to 7, in which "OK" means that a resin composition satisfied the UL94 V-0 requirement.

The spiral flow value and flow tester viscosity of each of the epoxy resin compositions were determined in the following manner.

[Spiral Flow Value]

A spiral flow mold was preliminarily heated up to a predetermined temperature (175±5° C.), and the powdery epoxy resin compositions were each poured in a pot of the mold to the innermost thereof. The mold was clamped and a clamping pressure was raised up to 210±10 kg/cm². When the clamping pressure reached 210±10 kg/cm², the melted epoxy resin composition was injected into the mold by means of a plunger. The injection pressure, after having reached 70±5 kg/cm², was maintained for 2 minutes. Subsequently, the plunger pressure of the transfer molding machine and the clamping pressure of the mold were released, and then the mold was opened. The spiral length of the molded form was measured with a precision of 2.5 mm. Thus, the spiral flow value was determined (in conformity with EMMI 1-66).

[Flow Tester Viscosity]

First, 2 g of each of the epoxy resin compositions was precisely weighed out, and formed into a tablet. The tablet was put in a pot of the Koka type flow tester, and the test was carried out with a load of 10 kg. The melt viscosity of the sample was determined on the basis of the traveling speed of the piston measured when the melted epoxy resin composition was extruded through an opening ($\phi$1.0 mm×10 mm) of the die.

A semiconductor element was encapsulated with each of the epoxy resin compositions of Examples and Comparative Examples by way of transfer molding (molding conditions: 175° C., 2 minutes), and allowed to stand for curing of the resin composition at 175° C. for 5 hours. Thus, a semiconductor device was obtained which had a 80-pin QFP structure (quad flat package structure having dimensions of 20 mm×14 mm×2 mm) with a die pad size of 8 mm×8 mm.

The semiconductor device thus obtained was inspected for defects such as deformation of gold wires thereof by observing an X-ray transmission image of the inside of the package by means of a soft X-ray apparatus. The results of the inspection are shown in Tables 5 to 7, in which "X" indicates that the deformation of the gold wires was detected and "○" indicates that a satisfactory package was obtained without any deformation of the gold wires.

The semiconductor device was non-destructively inspected by means of a scanning acoustic tomograph (ultrasonic flaw detector). Thereafter, the number of semiconductor devices (out of ten semiconductor devices for each of Examples and Comparative Examples) which suffered delamination (internal separation) was counted. After the inspection, intact semiconductor devices were further subjected to the following soldering test. The intact semiconductor devices were each pre-baked at 120° C. for 1 hour, and then allowed to absorb moisture at 85° C./85% RH for 168 hours. Thereafter, the semiconductor devices were each subjected to an evaluation test (on soldering crack resistance) by performing VPS (vapor phase soldering) at 215° C. for 90 seconds. The number of cracked semiconductor devices (out of ten semiconductor devices for each of Examples and Comparative Examples) was counted. The results of the evaluation are shown in Tables 5 to 7.

The semiconductor devices were each subjected to the pressure cooker biased test (PCBT) as a moisture resistance reliability test, and a time having elapsed until the defect ratio reached 50% was determined. The results are shown in Tables 5 to 7. It is noted that the PCBT were performed at 130° C./85% RH with a bias voltage of 30V.

TABLE 5

|  | Examples | | | | |
|---|---|---|---|---|---|
|  | 1 | 2 | 3 | 4 | 5 |
| Moldability | | | | | |
| Spiral flow value (cm) | 85 | 100 | 100 | 70 | 120 |
| Flow tester viscosity (poise) | 84 | 90 | 60 | 110 | 66 |
| Deformation of gold wires | ○ | ○ | ○ | ○ | ○ |
| Moisture resistance reliability | | | | | |
| pH of water containing extract from cured resin | 7.3 | 7.8 | 7.7 | 7.9 | 7.3 |
| Chlorine ion Concentration (μg) | 86.6 | 14.3 | 9.5 | 11 | 53 |
| Time (hr) having elapsed until defective ratio reached 50% in PCBT | >1000 | >1000 | >1000 | >1000 | >1000 |
| Flame retardance (UL94-V0) | V-0 OK | V-0 OK | V-0 OK | V-0 OK | V-0 OK |
| Soldering resistance (/10 devices) | 0/10 | 0/10 | 0/10 | 0/10 | 0/10 |

TABLE 6

| | Examples | | | | |
|---|---|---|---|---|---|
| | 6 | 7 | 8 | 9 | 10 |
| Moldability | | | | | |
| Spiral flow value (cm) | 102 | 75 | 100 | 100 | 90 |
| Flow tester viscosity (poise) | 75 | 130 | 120 | 120 | 110 |
| Deformation of gold wires | ○ | ○ | ○ | ○ | ○ |
| Moisture resistance reliability | | | | | |
| pH of water containing extract from cured resin | 7.6 | 7.2 | 6.5 | 6.8 | 6.8 |
| Chlorine ion Concentration (μg) | 8.5 | 5.4 | 10.0 | 9.7 | 10.5 |
| Time (hr) having elapsed until defective ratio reached 50% in PCBT | >1000 | >1000 | >1000 | >1000 | >1000 |
| Flame retardance (UL94-V0) | V-0 OK | V-0 OK | V-0 OK | V-0 OK | V-0 OK |
| Soldering resistance (/10 devices) | 0/10 | 0/10 | 0/10 | 0/10 | 0/10 |

TABLE 7

| | Comparative Examples | | |
|---|---|---|---|
| | 1 | 2 | 3 |
| Moldability | | | |
| Spiral flow value (cm) | 53 | 40 | 43 |
| Flow tester viscosity (poise) | 420 | 570 | 550 |
| Deformation of gold wires | X | X | X |
| Moisture resistance reliability | | | |
| pH of water containing extract from cured resin | 7.9 | 6.9 | 7.8 |
| Chlorine ion Concentration (μg) | 4.8 | 68.7 | 249 |
| Time (hr) having elapsed until defective ratio reached 50% in PCBT | >1000 | >1000 | >1000 |
| Flame retardance (UL94-V0) | V-0 OK | V-0 OK | V-0 OK |
| Soldering resistance (/10 devices) | 0/10 | 0/10 | 4/10 |

As apparent from Tables 5 to 7, the resin compositions of Examples each had a high flame retardance level, and were superior in fluidity with high spiral flow values and low flow tester viscosities. In addition, the resin compositions of Examples each had an excellent moldability as apparent from the fact that any deformation of gold wires was not detected. Further, the obtained semiconductor devices were excellent in moisture resistance reliability and soldering resistance.

On the other hand, the resin compositions of Comparative Examples each had a satisfactory flame retardance level, but were inferior in fluidity with lower spiral flow values and significantly higher flow tester viscosities than the resin compositions of Examples. This is apparent from the fact that the deformation of gold wires was detected. The semiconductor device obtained in Comparative Example 3 which employed the conventional metal hydroxide was inferior in moisture resistance reliability and soldering resistance.

Industrial Applicability

As described above, the present invention provides a resin composition for semiconductor encapsulating which contains a compound metal hydroxide of specific polyhedral crystal form (component (iii)) represented by the general formula (1). The use of the aforesaid particular compound metal hydroxide imparts the resin composition with an excellent flame retardance. In addition, corrosion of a semiconductor element and aluminum interconnections can be avoided without any influence of bromine and, therefore, the resin composition ensures an improved moisture resistance reliability and an extended service life in comparison with the case where a brominated epoxy resin is used as the flame retardant. Since the compound metal hydroxide has the aforesaid specific polyhedral crystal form rather than the conventional plate crystal form, the resin composition exhibits an excellent fluidity. Thus, drawbacks such as deformation of gold wires in the encapsulating of the semiconductor package can be avoided, thereby improving the moldability. In addition to the flame retardance and moldability improvement effects, the use of the compound metal hydroxide of polyhedral crystal form (component (iii)) reduces the amount of the flame retardant required for ensuring a flame retardance level equivalent to or greater than that achieved by the use of a conventionally known metal hydroxide flame retardant, since the compound metal hydroxide of polyhedral crystal form can homogeneously be dispersed in the semiconductor encapsulating resin composition. As a result, water absorption of the resin composition is suppressed and, hence, the resin composition exhibits an improved soldering resistance. The use amount of the compound metal hydroxide of polyhedral crystal form can be reduced in comparison with a case where the conventional compound metal hydroxide of thin plate or scaly crystal form is used. Therefore, where silica powder is used in combination with the compound metal hydroxide, for example, the proportion of the silica powder can be increased, so that the resulting semiconductor device has a lower linear expansion coefficient and a higher mechanical strength.

Where the particular compound metal hydroxide of the aforesaid crystal form has an average particle diameter of 0.5 μm to 10 μm, the reduction in the fluidity of the resin composition can be suppressed with an excellent flame retardance effect, further improving the moldability.

Where the aforesaid compound metal hydroxide has an aspect ratio of 1 to 8, the viscosity of the resin composition can effectively be reduced, further improving the moldability.

Hence, the semiconductor device encapsulated with the semiconductor encapsulating resin composition according to the present invention features a highly safe flame retardance technique and an remarkably improved reliability. The resin composition exhibits an excellent moldability in the process for fabricating a semiconductor device by transfer molding with the use of the aforesaid semiconductor encapsulating resin composition or in the process for fabricating a semiconductor device by utilizing a sheet of the semiconductor encapsulating resin composition. The resin composition according to the present invention is particularly useful for packaging of thin and larger size semiconductor devices among other semiconductor devices, and has a great significance in industrial applications.

What is claimed is:

1. A semiconductor encapsulating resin composition, comprising:
   (i) a thermosetting resin;
   (ii) a hardening agent; and
   (iii) a compound metal hydroxide of polyhedral crystal form having an aspect ratio of 1 to 8 represented by the following general formula (1):

$$m(M_aO_b)\cdot n(Q_dO_e)\cdot cH_2O \qquad (1)$$

wherein M and Q are different metal elements; Q is a metal element which belongs to a group selected from IVa, Va, VIa, VIIa, VIII, Ib and IIb groups in the periodic table; m, n, a, b, c, d and e, which may be the same or different, each represents a positive number.

2. A semiconductor encapsulating resin composition as set forth in claim 1, wherein the metal element M in the compound metal hydroxide represented by the general formula (1) is at least one metal element selected from the group consisting of aluminum, magnesium, calcium, nickel, cobalt, tin, zinc, copper, iron, titanium and boron.

3. A semiconductor encapsulating resin composition as set forth in claim 1 or 2, wherein the metal element Q in the compound metal hydroxide represented by the general formula (1) is at least one metal element selected from the group consisting of iron, cobalt, nickel, palladium, copper, zinc and cadmium.

4. A semiconductor encapsulating resin composition as set forth in claim 1, wherein the compound metal hydroxide represented by the general formula (1) has an average particle diameter of 0.5 μm to 10 μm.

5. A semiconductor encapsulating resin composition as set forth in claim 1, wherein the compound metal hydroxide of polyhedral crystal form represented by the general formula (1) constitutes 30% to 100% by weight of a total weight of compound metal hydroxides.

6. A semiconductor encapsulating resin composition as set forth in claim 1, wherein the compound metal hydroxide represented by the general formula (1) is represented by $sMgO\cdot(1-s)Nio\cdot cH_2O$ [0<s<1, 0<c≦1].

7. A semiconductor encapsulating resin composition as set forth in claim 1, wherein the compound metal hydroxide represented by the general formula (1) is represented by $sMgO\cdot(1-s)ZnO\cdot cH_2O$ [0<s<1, 0<c≦1].

8. A semiconductor encapsulating resin composition as set forth in claim 1, wherein the compound metal hydroxide represented by the general formula (1) is contained in an amount ranging from 1% to 30% by weight of the total resin composition.

9. A semiconductor encapsulating resin composition as set forth in claim 1, wherein an extraction liquid containing an extract from a cured form of the resin composition has a pH level ranging from pH6.0 to pH8.0 and a chlorine ion concentration of not higher than 200 μg per gram of the cured form of the resin composition.

10. A semiconductor encapsulating resin composition as set forth in claim 1, wherein a cured form of the semiconductor encapsulating resin composition hazing a thickness of 1/16 inch has a flame retardance level equivalent to the V-0 level of the UL94 combustion test.

11. A semiconductor encapsulating resin composition as set forth in claim 1, wherein the thermosetting resin as the component (i) is an epoxy resin.

12. A semiconductor encapsulating resin composition as set forth in claim 1, wherein the hardening agent as the component (ii) is a phenol resin.

13. A semiconductor encapsulating resin composition as set forth in claim 1, wherein compound metal hydroxides including the compound metal hydroxide of polyhedral crystal form as the component (iii) and an inorganic filler are contained in a total amount of 60% to 92% by weight of the total resin composition.

14. A semiconductor encapsulating resin composition as set forth in claim 1, wherein compound metal hydroxides including the compound metal hydroxide of polyhedral crystal form as the component (iii) and an inorganic filler are contained in a total amount of 70% to 90% by weight of the total resin composition.

15. A semiconductor encapsulating resin composition as set forth in claim 13, wherein the inorganic filler is silica powder.

16. A semiconductor device fabricated by encapsulating a semiconductor element with a semiconductor encapsulating resin composition as recited in claim 1.

17. A process for fabricating a semiconductor device, characterized in that a semiconductor element is encapsulated with a semiconductor encapsulating resin composition as recited in claim 1 by a transfer molding method.

18. A process for fabricating a semiconductor device, characterized in that a sheet encapsulating material composed of a semiconductor encapsulating resin composition as recited in claim 1 is used.

19. A semiconductor encapsulating resin composition as set forth in claim 2, wherein the metal element Q in the compound metal hydroxide represented by the general formula (1) is at least ore metal element selected from the group consisting of iron, cobalt, nickel, palladium, copper, zinc and cadmium.

* * * * *